(12) United States Patent
Park et al.

(10) Patent No.: US 8,923,064 B2
(45) Date of Patent: Dec. 30, 2014

(54) SEMICONDUCTOR MEMORY DEVICE AND METHOD OF OPERATING THE SAME

(71) Applicant: SK Hynix Inc., Icheon-si Gyeonggi-do (KR)

(72) Inventors: Noh Yong Park, Seoul (KR); Hyung Seok Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 84 days.

(21) Appl. No.: 13/706,040

(22) Filed: Dec. 5, 2012

(65) Prior Publication Data

US 2013/0141982 A1 Jun. 6, 2013

(30) Foreign Application Priority Data

Dec. 6, 2011 (KR) ........................ 10-2011-0129677

(51) Int. Cl.
*G11C 16/14* (2006.01)
*G11C 16/04* (2006.01)
*G11C 16/16* (2006.01)
*G11C 16/34* (2006.01)

(52) U.S. Cl.
CPC ................ *G11C 16/04* (2013.01); *G11C 16/16* (2013.01); *G11C 16/3445* (2013.01); *G11C 16/0483* (2013.01)
USPC ............ 365/185.19; 365/185.18; 365/185.22; 365/185.27; 365/185.29

(58) Field of Classification Search
CPC .... G11C 16/04; G11C 16/0483; G11C 16/14; G11C 16/16; G11C 16/344; G11C 16/3445; G11C 11/5635
USPC ............. 365/185.18, 185.19, 185.22, 185.24, 365/185.27, 185.29, 185.3
See application file for complete search history.

(56) References Cited

U.S. PATENT DOCUMENTS

| | | | | |
|---|---|---|---|---|
| 5,258,947 A * | 11/1993 | Sourgen | ........................... | 365/96 |
| 6,052,305 A * | 4/2000 | Yang et al. | ............... | 365/185.18 |
| 7,889,562 B2 * | 2/2011 | Nobunaga | ................ | 365/185.19 |
| 8,004,900 B2 * | 8/2011 | Dutta et al. | .............. | 365/185.19 |
| 2010/0238730 A1 * | 9/2010 | Dutta et al. | .............. | 365/185.17 |

* cited by examiner

*Primary Examiner* — Tan T. Nguyen
(74) *Attorney, Agent, or Firm* — William Park & Associates Patent Ltd.

(57) ABSTRACT

A semiconductor memory device includes a memory array including a plurality of memory cells, and a peripheral circuit configured to perform an erase operation by supplying a first erase voltage to selected memory cells and perform an erase verify operation by supplying an erase verify voltage to the selected memory cells, wherein the peripheral circuit is configured to increase the first erase voltage to a first level at a first rising rate for a first rising period and increase the first erase voltage to a first target level at a second rising rate lower than the first rising rate for a second rising period.

21 Claims, 5 Drawing Sheets

SEMICONDUCTOR MEMORY DEVICE AND METHOD OF OPERATING THE SAME

The present application claims priority to Korean patent application number 10-2011-0129677 filed on Dec. 6, 2011, in the Korean Intellectual Property Office, the entire disclosure of which is incorporated by reference herein.

BACKGROUND

1. Technical Field

Various embodiments relate generally to a semiconductor memory device and a method of operating the same and, more particularly, to a semiconductor memory device including memory cells and a method of operating the same.

2. Related Art

A semiconductor memory device includes a memory array. The memory array includes a plurality of memory cells. Connection relationships and arrangements of memory cells vary depending on types of memory devices. For example, in a NAND flash memory device, memory cells are coupled in series between bit lines and a source line.

An operating voltage is to be supplied to memory cells in order to store data in the memory cells, output data stored in the memory cells or erase the data stored in the memory cells. In a NAND flash memory device, a considerably high voltage is supplied to memory cells in order to perform the above-described operations. A high erase voltage may be supplied to a bulk (well or P well) of the memory cells, especially during an erase operation.

One of the key reliability indicators for a flash memory device is endurance that determines how many times a program operation performed to store data and an erase operation performed to erase the data are repeated. Endurance is directly associated with performance of the flash memory device. Since a high voltage is supplied to memory cells during a program operation or an erase operation, stress may be applied to the memory cells. When a high voltage is supplied to a bulk of a memory cell during an erase operation, an erase voltage may sharply increase from 0V to a target level. As a result, an excessive electric field may be applied to an insulating layer (for example, a tunnel insulating layer or a dielectric layer) included in the memory cell. As a result, characteristics of the insulating layer may be deteriorated. In addition, with increasing cumulative numbers of program operations and erase operations, if a higher erase voltage is supplied to compensate for deterioration of erase characteristics, the characteristics of the insulating layers may be further deteriorated.

Since the accumulated stress may cause failures, stress is to be reduced to improve the reliability of a memory device.

BRIEF SUMMARY

Various embodiments relate to a semiconductor memory device and a method of operating the same capable of minimizing stress of memory cells during operations of the memory cells.

A semiconductor memory device according to an embodiment includes a memory array including a plurality of memory cells, and a peripheral circuit configured to perform an erase operation by supplying a first erase voltage to selected memory cells and perform an erase verify operation by supplying an erase verify voltage to the selected memory cells, wherein the peripheral circuit is configured to increase the first erase voltage to a first level at a first rising rate for a first rising period and increase the first erase voltage to a first target level at a second rising rate lower than the first rising rate for a second rising period.

A semiconductor memory device according to an embodiment includes a memory array including a plurality of memory cells, and a peripheral circuit configured to perform an erase operation by supplying a first erase voltage to selected memory cells and perform an erase verify operation by supplying an erase verify voltage to the selected memory cells wherein the peripheral circuit is configured to increase the first erase voltage to a first level at a highest rate for a first rising period and increase the first erase voltage to a first target level while reducing a rising rate for at least two other rising periods.

A method of operating a semiconductor memory device according to an embodiment includes increasing an erase voltage supplied to a bulk of selected memory cells to perform an erase operation to a first level at a first rising rate for a first rising period, increasing the erase voltage to a target level at a second rising rate lower than the first rising rate for a second rising period, discharging the erase voltage, and performing an erase verify operation on the selected memory cells.

DETAILED DESCRIPTION

Hereinafter, various embodiments will be described in detail with reference to the accompanying drawings. The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
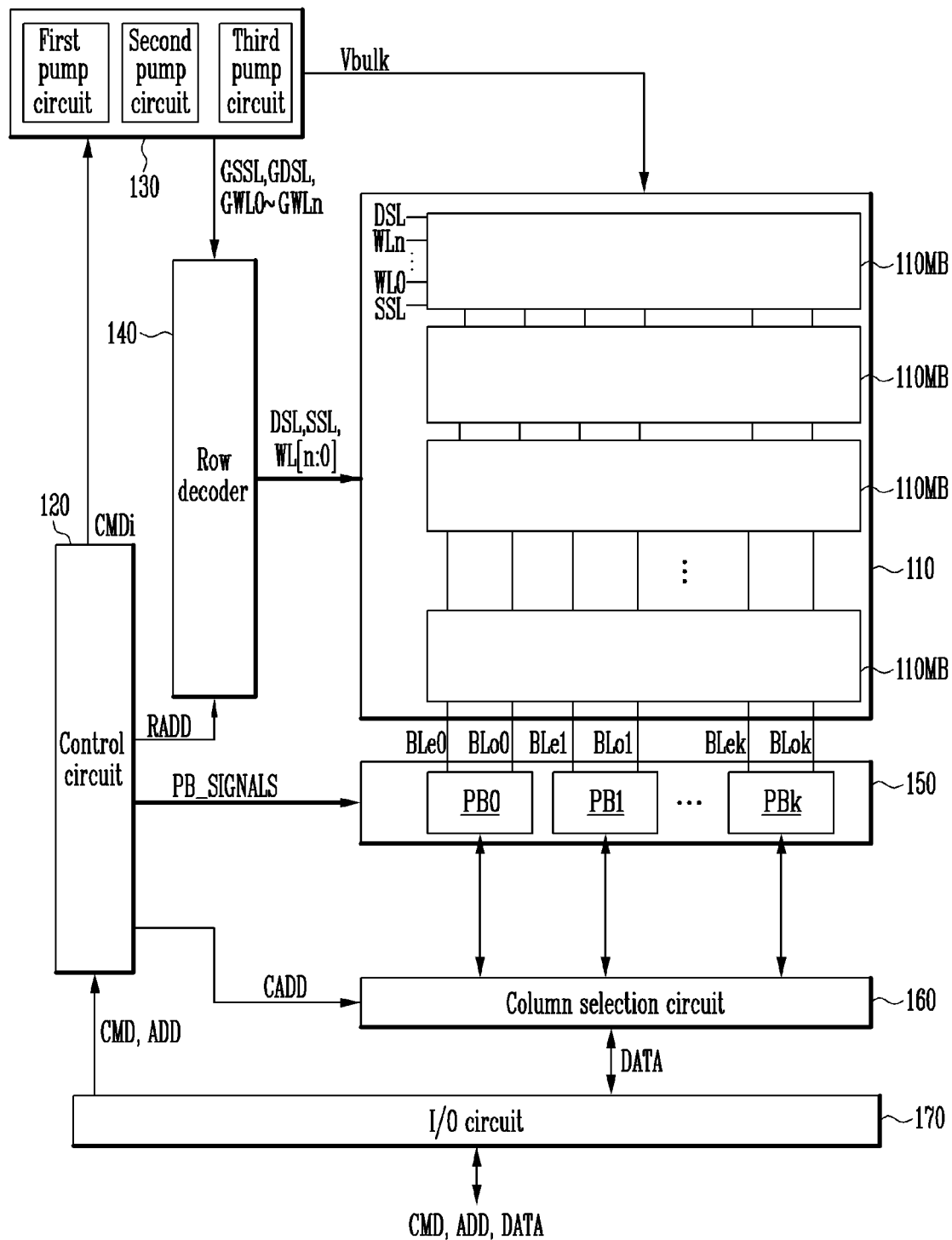
FIG. 1 is a circuit diagram of a semiconductor memory device according to an embodiment.

FIG. 1 is a circuit diagram of a semiconductor memory device according to an embodiment.

Referring to FIG. 1, the semiconductor memory device may include a memory array 110 and peripheral circuits 120 to 170. The memory array 110 may include a plurality of memory cells, which may be grouped in memory blocks. The peripheral circuits 120 to 170 may include a control circuit 120, a voltage generation circuit 130, a row decoder 140, a page buffer group 150, a column selection circuit 160, and an input/output (I/O) circuit 170.

The voltage generation circuit 130 and the row decoder 140 may constitute a power supply circuit, which supplies various operating voltages used for a program operation, a read operation or an erase operation to a selected memory block. The page buffer group 150 may control or sense voltages of bit lines BLe0 to BLeK and BLo0 to BLok during data I/O operations. The column selection circuit 160 may control data transfers (i.e., DATA) between the page buffer group 150 and the I/O circuit 170. The I/O circuit 170 may transfer a command signal CMD, an address signal ADD and data DATA, which are externally input, to internal circuits including the control circuit 120 and the page buffer group 150, or may externally transfer data latched in the page buffer group 150 from the memory cells. Operation circuits (130 to 170) may be controlled by the control circuit 120 during a program operation, a read operation and erase operation related to input/output and erasure of data. These components are described below in more detail.

Figure 2:
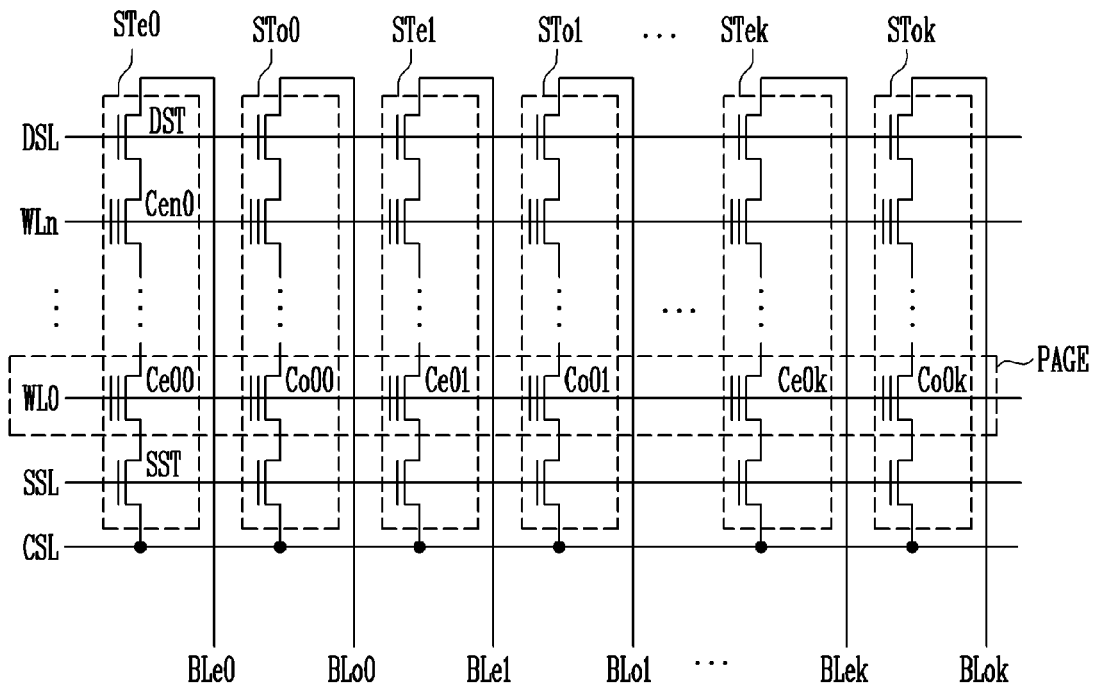
FIG. 2 is a circuit diagram of a memory block illustrated in FIG. 1.

FIG. 2 is a circuit diagram of memory blocks illustrated in FIG. 1.

Referring to FIG. 2, each memory block may include plurality of strings STe0 to STek and STo0 to STok that are coupled between the bit lines BLe0 to BLeK and BLo0 to Blok and a common source line CSL. Additionally, the strings STe0 to STek and STo0 to STok may be coupled to the bit lines BLe0 to BLeK and BLo0 to Blok, respectively, and coupled in common to the common source line CSL. Each string, for example, the string STe0 may include a source selection transistor SST, a plurality of memory cells Ce00 to Cen0 and a drain selection transistor DST. Here, a source of the source selection transistor SST may be coupled to the common source line CSL, and a drain of the drain selection transistor DST may be coupled to the bit line BLe0. The memory cells Ce00 to Cen0 may be coupled in series between the source and drain selection transistors SST and DST. A gate of the source selection transistor SST may be coupled to a source selection line SSL, gates of the memory cells Ce00 to Cen0 may be coupled to word lines WL0 to WLn, respectively, and a gate of the drain selection transistor DST may be coupled to a drain selection line DSL.

In a NAND flash memory, memory cells included in a memory cell block may be divided into physical pages or logical pages. For example, memory cells Ce00 to Ce0*k* and Co00 to Co0*k* coupled to a single word line, for example, the word line WL0 may form a single physical page PAGE. In addition, even memory cells Ce00 to Ce0*k* coupled to the word line WL0 may form a single even physical page, and odd memory cells Co00 to Co0*k* may form a single odd physical page. These pages (or an even page and an odd page) may be a basic unit for a program operation or a read operation. In addition, a memory block may be a basic unit for an erase operation.

Figure 3:
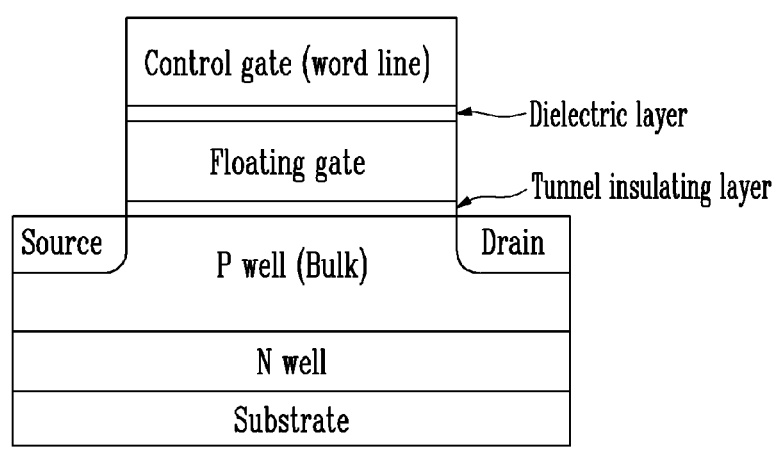
FIG. 3 is a cross-sectional view of a structure of a memory cell illustrated in FIG. 2.

FIG. 3 is a cross-sectional view of a structure of a memory cell illustrated in FIG. 2.

Referring to FIG. 3, a P well corresponding to a bulk of a memory cell or a memory block may be formed in a semiconductor substrate. The P well (Bulk) may be surrounded by an N well. The memory cell may include a word line (or a gate line) that is formed over the P well and source/drain regions that are formed in the P well at both sides of the word line. The source/drain regions may be formed by implanting N type impurities.

The word line may have a stacked structure that includes a tunnel insulating layer, a floating gate, a dielectric layer and a control gate. The above-described memory cell structure with reference to FIG. 3 only, is known in the field of the invention.

A ground voltage or a positive voltage of 2V or less may be supplied to the control gate (or word line) during an erase operation. A high erase voltage of 15V to 20V may be supplied to the bulk. A voltage difference between the word line and the bulk may cause electrons trapped in the floating gate to exit the floating gate through the tunnel insulating layer to the bulk. As a result, a threshold voltage of the memory cell may be reduced, and the memory cell may be erased. An erase voltage to be described below refers to a voltage supplied to the bulk of the memory cell. Since memory cells of a memory block share a bulk, an erase voltage supplied to the bulk may affect all the memory cells included in the memory block. However, if word lines of an unselected memory block are set to a floating state, potentials of the word lines may also increase due to capacitive coupling when the erase voltage is supplied. Therefore, memory cells of the unselected memory block may not be erased due to a small voltage difference between the word lines and the bulk.

With reference to FIGS. 1 and 2, the control circuit 120 may output an internal command signal CMDi to perform a program operation, a read operation or an erase operation in response to the command signal CMD externally input through the I/O circuit 170 and may output Page Buffer control signals PB_SIGNALS to control page buffers PB0 to PBk included in the page buffer group 150 according to types of operations. In addition, the control circuit 120 may output a row address signal RADD and a column address signal CADD in response to the address signal ADD externally input through the I/O circuit 170.

The voltage generation circuit 130 may output operating voltages used for a program operation, a read operation or an erase operation of the memory cells onto global lines GSSL, GWL0 to GWLn and GDSL in response to the internal command signal CMDi output from the control circuit 120. In addition, the voltage generation circuit 130 may output an erase voltage Vbulk to a bulk (e.g., P well) where memory blocks 110MB are formed during an erase operation.

The voltage generation circuit 130 may include a plurality of pump circuits in order to generate high voltages of various voltage levels such as a program voltage, a read voltage, a pass voltage and an erase voltage. For example, first to third pump circuits may output high voltages of different voltage levels. In addition, the first to third pump circuits may output high voltages of different voltage levels by increasing the respective high voltages to different target levels. Additionally, the first pump circuit may be provided to generate a program pass voltage, the second pump circuit may be provided to generate a program voltage, and the third pump circuit may be provided to generate a read voltage. Other pump circuits may be added to generate different voltages of various voltage levels.

The voltage generation circuit 130 may be configured to supply the erase voltage Vbulk with various pulse shapes to the bulk in order to minimize stress applied to the memory cell during the erase operation. The voltage generation circuit 130 may control the erase voltage Vbulk so that an initial rising rate thereof may be different from a rising rate of when the erase voltage Vbulk reaches a target level. In other words, the voltage generation circuit 130 may control the initial rising rate of the erase voltage Vbulk to be higher than the rising rate of when the erase voltage Vbulk reaches the target level.

The voltage generation circuit 130 may further include another pump circuit configured to generate the erase voltage Vbulk. In addition, the voltage generation circuit 130 may generate the erase voltage Vbulk by using the first pump circuit configured to generate the pass voltage and the second pump configured to generate the program voltage. For example, at an initial stage, a high voltage generated from the first pump circuit may be output to the bulk of the selected memory block. After the high voltage of the first pump circuit increases to a first level, the second pump circuit may increase the high voltage, output to the bulk, to the target level at a low rising rate by using the high voltage of the first pump circuit. In order to use the high voltages generated from the first and second pump circuits as the erase voltage Vbulk, the high voltages from the first and second pump circuits may be switched on the bulk.

In order to perform an erase operation, the voltage generation circuit 130 may supply word line voltages of a ground level to the word lines (e.g., WL0) of the selected memory block and set the drain and source selection lines DSL and SSL to a floating state. In addition, the voltage generation circuit 130 may supply the erase voltage Vbulk to the bulk of the selected memory block.

If a non-erased cell is detected during an erase verify operation after the erase operation is performed, an additional erase operation may be performed. During the additional erase operation, the voltage generation circuit 130 may increase the erase voltage Vbulk to the bulk of the selected memory block. Such a method is referred to as an Increment Step Pulse Erase (ISPE) method. The erase verify operation may be performed by the page buffer group 150 under the control of the control circuit 120. Since the erase verify operation is widely known, a detailed description thereof is omitted.

The row decoder 140 may transfer the operating voltages output from the voltage generation circuit 130 onto the global lines GSSL, GWN0 to GWLn and GDSL to local lines SSL, WN0 to WLn and DSL of the selected memory block, among the memory blocks 110MB of the memory array 110, in response to the row address signal RADD. Here, the row decoder 140 may couple the global lines GSSL, GWN0 to GWLn and GDSL to the local lines DSL, WL0 to WLn and SSL of the selected memory block 110MB in response to the row address signal RADD.

During the erase operation, the row decoder 140 may set local lines of unselected memory blocks to a floating state.

The page buffer groups 150 may include the plurality of page buffers PB0 to PBk coupled to the bit lines BLe0 to BLeK and BLo0 to BLok, respectively. Each one of the page buffers PB0 to PBk of the page buffer group 150 may be coupled to a corresponding pair of even and odd bit lines. In response to the PB control signals PB_SIGNALS from the control circuit 120, the page buffers PB0 to PBk may selectively precharge the bit lines BLe0 to BLek or BLo0 to Blok according to data being input in order to store the data in the memory cells Ce00 to Ce0$k$ or Co00 to Co0$k$, or the page buffers PB0 to PBk may sense the voltages of the bit lines BLe0 to BLek or BLo0 to Blok in order to read the data from the memory cells Ce00 to Ce0$k$ or Co00 to Co0$k$ or perform a verify operation.

For example, during an erase verify operation, the page buffer group 150 may precharge all the selected bit lines (e.g., BLe0 to BLek) and discharge all the unselected bit lines (e.g., BLo0 to BLok). Subsequently, when an erase verify voltage is supplied from the power supply circuit (130 and 140) to the word lines WL0 to WLn by the voltage generation circuit 130 and the row decoder 140, a bit line of a memory string including only erased memory cells may be discharged, and a bit line of a memory string including a non-erased cell may remain precharged. The page buffer group 150 may sense changes in voltages of the bit lines BLe0 to BLek and latch erasing result data corresponding to a sensing result. The control circuit 120 may determine whether or not to perform an additional erase operation in response to the erasing result data output from the page buffer group 150.

The column selection circuit 160 may select the page buffers PB0 to PBk included in the page buffer group 150 in response to the column address CADD output from the control circuit 120. In other words, the column selection circuit 160 may sequentially transfer data to be stored in the memory cells to the page buffers PB0 to PBk in response to the column address CADD during a program operation. In addition, the column selection circuit 160 may sequentially select the page buffers PB0 to PBk in response to the column address CADD so that the data of the memory cells latched in the page buffers PB0 to PBk may be externally output during a read operation.

The I/O circuit 170 may transfer the externally input data to the column selection circuit 160 to input the data to the page buffer group 150 under the control of the control circuit 120 so that the data may be stored in the memory cells during the program operation. In addition, during the read operation, the I/O circuit 170 may externally output the data transferred from the page buffers PB0 to PBk of the page buffer group 150 through the column selection circuit 160.

Hereinafter, a method of operating the semiconductor memory device having the above-described configuration to perform an erase operation while stress on memory cells is minimized is described below.

Figure 4:
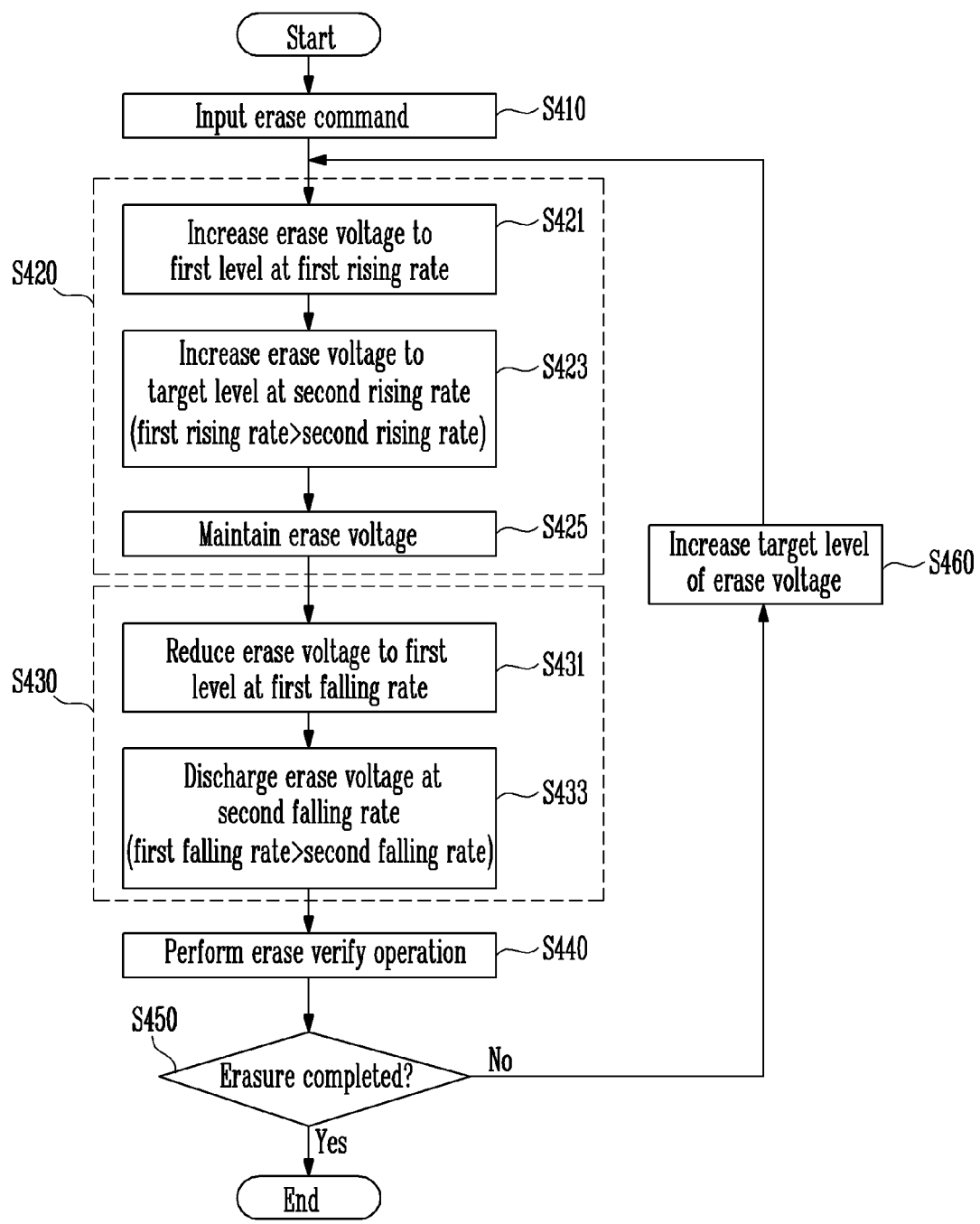
FIG. 4 is a flowchart illustrating a method of operating a semiconductor memory device according to an embodiment.

FIG. 4 is a flowchart illustrating a method of operating a semiconductor memory device according to an embodiment. FIGS. 5A to 5F are waveforms of erase voltages to illustrate a method of operating a semiconductor memory device according to an embodiment.

Figure 5A:
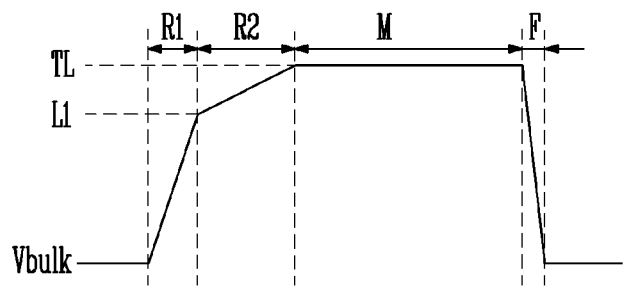
FIGS. 5A to 5F are waveforms of erase voltages to illustrate a method of operating a semiconductor memory device according to an embodiment.

Referring to FIGS. 1, 4 and 5A, commands such as an erase command signal and an address may be input to perform an erase operation on a selected memory block (or selected memory cells) at step S410 (i.e., Input erase command). At step S420, the voltage generation circuit 130 may supply the erase voltage Vbulk to the bulk of the memory cells in response to these signals during the erase operation. The erase voltage Vbulk may be supplied in the following manner:

Since an excessive electric field is applied to the tunnel insulating layer or the dielectric layer when the erase voltage Vbulk sharply increases from 0V to a target level, the characteristics of the tunnel insulating layer or the dielectric layer may be deteriorated. In addition, since erase characteristics are deteriorated with increasing cumulative numbers of program operations and erase operations, the erase voltage Vbulk is to be increased. In this case, the characteristics of the tunnel insulating layer or the dielectric layer may be severely deteriorated.

In order to compensate for the deterioration of the characteristics of the tunnel insulating layer or the dielectric layer, the erase voltage Vbulk may be gradually increased to a target level TL. However, it may take a considerable amount of time for the erase voltage Vbulk to reach the target level TL, and the total time taken to perform the erase operation may be extended, which may cause a reduction in the operating speed of the semiconductor memory device.

Therefore, when the erase voltage Vbulk starts to increase, the erase voltage Vbulk may be quickly increased since the erase voltage Vbulk is low. When the erase voltage Vbulk reaches a predetermined level, a rising rate of the erase voltage Vbulk may be lowered. In a period in which the erase voltage Vbulk is low, even when the erase voltage Vbulk is increased at a high rate, stress may not be an issue since low electric field strength is applied to the tunnel insulating layer or the dielectric layer. In addition, since the erase voltage Vbulk is quickly increased, the time taken for the erase voltage Vbulk to reach the target level may be reduced. Moreover, the stress of the electric field applied to the tunnel insulating layer or the dielectric layer may be reduced by lowering the rising rate in a period in which the erase voltage Vbulk is high. These operations are further described below.

When the internal command signal CMDi is supplied to perform an erase operation, the voltage generation circuit 130 may supply the erase voltage Vbulk to the bulk of the memory cells. Here, a pulsed voltage to be described below may be supplied as the erase voltage Vbulk.

Basically, while the erase voltage Vbulk supplied to the bulk of the selected memory block (or selected memory cells) is being increased to the target level TL, as the erase voltage Vbulk increases, a peripheral circuit (particularly the voltage generation circuit) may reduce the rising rate of the erase voltage Vbulk.

First, the peripheral circuit may increase the erase voltage Vbulk to a first level L1 at a first rising rate for a first rising period R1 at step S421 (i.e., Increase erase voltage to first level at first rising rate). The erase voltage Vbulk may be increased to the target level TL at a second rising rate lower than the first rising rate for a second rising period R2 at step S423 (i.e., Increase erase voltage to target level at second rising rate (first rising rate>second rising rate). Here, the erase voltage Vbulk may be increased to the first level L1 by the first pump circuit of the voltage generation circuit 130 for the first rising period R1, and the erase voltage Vbulk may be increased to the target level TL by the second pump circuit of the voltage generation circuit 130 for the second rising period R2.

Subsequently, the peripheral circuit may maintain the erase voltage Vbulk at the target level TL for a maintaining period M at step S425 (i.e., Maintain erase voltage). The peripheral circuit may increase the erase voltage Vbulk at the first rising rate until electrons trapped in the memory cells are emitted to a substrate, and the peripheral circuit may reduce the rising rate of the erase voltage Vbulk to the second rising rate from when the electrons start to be emitted. Here, the first level L1 may correspond to a voltage level of the erase voltage Vbulk that is supplied to the bulk when the electrons start to be emitted.

As described above, the erase voltage Vbulk may be quickly increased at the first rising rate when the erase voltage Vbulk is low, while the erase voltage Vbulk may be gradually increased at the second rising rate when the erase voltage Vbulk is high, so that an increase in the amount of time required to perform an erase operation on the memory cells may be reduced, and at the same time, stress applied to the memory cells may be reduced.

After the erase voltage Vbulk is supplied for the target times R1, R2 and M, the peripheral circuit may discharge the erase voltage Vbulk for a falling period F at step S430. Subsequently, an erase verify operation may be performed under the control of the control circuit at step S440 (i.e., Perform erase verify operation).

Here, the first rising period R1 may be set to be the shortest period, and the maintaining period M may be set to be the longest period.

Figure 5B:
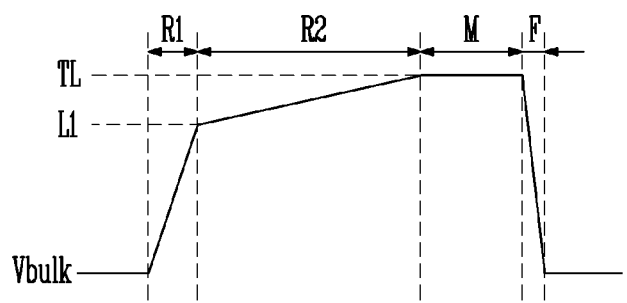

Referring to FIGS. 1, 4 and 5B, on the basis of the total time taken to supply the erase voltage Vbulk, the peripheral circuit may maintain a time and a rising rate of the first rising period R1 at step S421 at the time and the rising rate illustrated in FIG. 5A, and may set the second rising period R2 at step S423 to be the longest period. In this case, the maintaining period M at step S425 may be shortened. As the second rising period R2 is lengthened, the rising rate of the erase voltage Vbulk for the second rising period R2 may be lower than the rising rate shown in FIG. 5A. Therefore, stress applied to the memory cells may be more reduced.

After the erase voltage Vbulk is applied for the target times R1, R2 and M, the peripheral circuit may discharge the erase voltage Vbulk for the falling period F at step S430. Subsequently, an erase verify operation may be performed under the control of the control circuit at step S440.

Figure 5C:
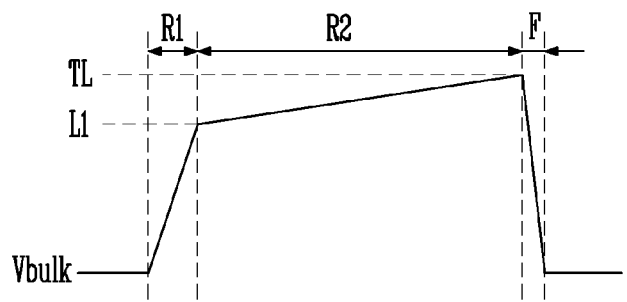

Referring to FIGS. 1, 4 and 5C, on the basis of the total time taken to supply the erase voltage Vbulk, the peripheral circuit may maintain a time and a rising rate of the first rising period R1 at step S421 at the time and the rising rate illustrated in FIG. 5A, and may designate the remaining time as the second rising period R2 at step S423. More specifically, the peripheral circuit may increase the erase voltage Vbulk to the first level L1 at a first rising rate for the first rising period R1 at step S421, increase the erase voltage Vbulk to the target level TL at a second rising rate lower than the first rising rate for the second rising period R2 at step S423, and discharge the erase voltage Vbulk for the falling period F at step S430. Here, the maintaining period M at step S425 may not be present. As the remaining periods other than the first rising period R1 are all set to the second rising period R2, the rising rate of the erase voltage Vbulk for the second rising period R2 may become much lower than the rising rate illustrated in FIG. 5A. Therefore, stress applied to the memory cells may be further reduced.

Here, though there is no maintaining period M described at step S425, since the electrons are also emitted from the memory cell for the second rising period R2, it may be enough to erase a memory cell.

After the erase voltage Vbulk is applied for the target times R1 and R2, the peripheral circuit may discharge the erase voltage Vbulk for the falling period F at step S430. Subsequently, an erase verify operation may be performed under the control of the control circuit at step S440.

The second rising period R2 of the erase voltage Vbulk described in FIG. 5B and FIG. 5C may be longer than the first rising period R1, the maintaining period M, or a period of the first rising period R1 and the maintaining period M combined.

Figure 5D:
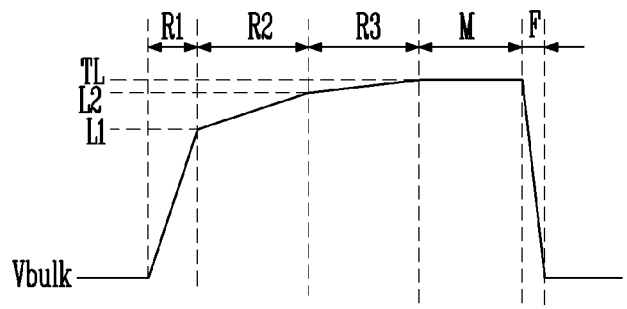

Referring to FIGS. 1 and 5D, the peripheral circuit may increase the erase voltage Vbulk to the first level L1 at the highest rising rate for the first rising period R1, among the plurality of rising periods R1, R2 and R3, and may increase the erase voltage Vbulk from the second level L2 to the target level TL by gradually lowering the rising rate of the erase voltage Vbulk for the remaining rising periods R2 and R3. After the erase voltage Vbulk reaches the target level TL, the peripheral circuit may maintain the erase voltage Vbulk at the target level TL for the maintaining period M. As illustrated in FIG. 5C, the maintaining period M may be omitted.

Here, as the voltage level of the erase voltage Vbulk increases, the rising rate thereof may decrease. Therefore, stress applied to the memory cell may be further reduced.

After the erase voltage Vbulk is supplied for the target times R1, R2, R3 and M, the peripheral circuit may discharge the erase voltage Vbulk for the falling period F. Subsequently, an erase verify operation may be performed under the control of the control circuit.

Figure 5E:
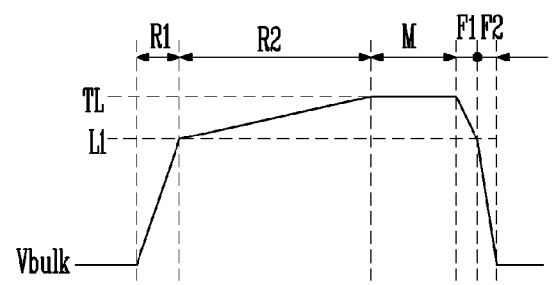
Figure 5F:
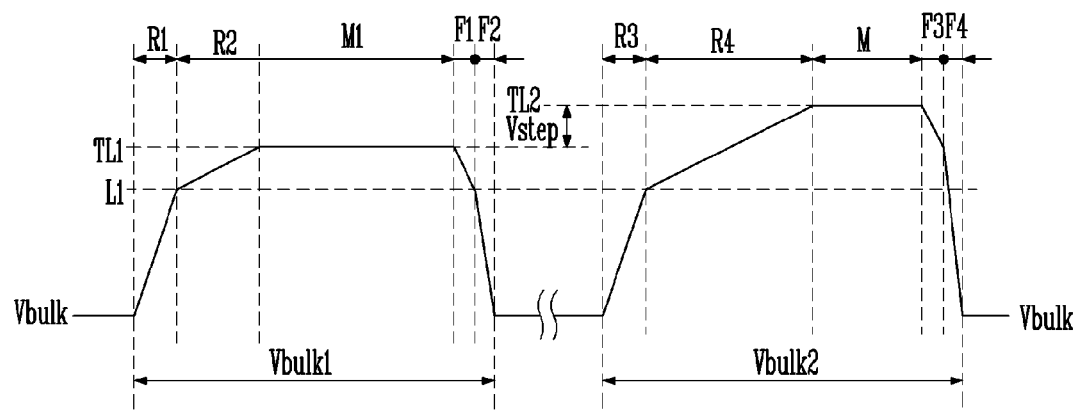

When the erase voltage Vbulk is discharged at step S430, if the erase voltage Vbulk changes drastically, stress may be applied to a memory cell. Therefore, the erase voltage Vbulk may be discharged by the following manner:

Referring to FIGS. 1, 4 and 5E, basically, while the erase voltage Vbulk supplied to the bulk of the memory block (or selected memory cells) is being discharged, the peripheral circuit may lower a falling rate for a period when the erase voltage Vbulk is high and may increase the falling rate for a period when the erase voltage Vbulk is low. In other words, the peripheral circuit may reduce the erase voltage Vbulk to the first level L1 at the highest falling rate for a first falling period F1 among a plurality of falling periods F1 and F2 (only two periods shown for illustration purposes), and may discharge the erase voltage Vbulk by gradually increasing the falling rate of the erase voltage Vbulk for the other falling period F2.

Additionally, after the erase voltage Vbulk is supplied for the target times R1, R2 and M, the peripheral circuit may reduce the erase voltage Vbulk to the first level L1 at a first falling rate for the first falling period F1 at step S431 (i.e., Reduce erase voltage to first level at first falling rate) and discharge the erase voltage Vbulk at a second falling rate higher than the first falling rate of the first falling period F1 for the second falling period F2 at step S433 (i.e., Discharge erase voltage at second falling rate (first falling rate>second falling rate).

Here, a time at which the first falling period F1 ends may be controlled to be substantially the same as a time at which the first rising period R1 ends. In addition, the first falling period F1 corresponding to the first falling period may be set to be longer than the second falling period F2 or the remaining falling periods.

In addition, since the voltage level of the erase voltage Vbulk is substantially the same as the target level TL in the last falling period R2, an erase phenomenon in which the electrons trapped in the memory cell are emitted may occur. As a result, the erase phenomenon in which the electrons trapped in the memory cell are emitted may be continued even for the first falling period F1. Therefore, the first falling period F1 may be included in the target time when the erase voltage Vbulk is supplied. In other words, the voltage level of the erase voltage Vbulk may be reduced at a low falling rate in advance at a point where the target time when the erase voltage Vbulk is supplied ends.

As described above, a drastic change in the electric field applied to the memory cell may be reduced by lowering a rate of change of the erase voltage Vbulk in a period when the erase voltage Vbulk is high, thereby further reducing stress applied to the memory cell.

Referring to FIGS. 4 and 5E, an erase verify operation may be performed at step S440 after one of the erase voltages described with reference to FIGS. 5A to 5D is supplied. When it is determined that the erase operation has not been completed (i.e., No) since a non-erased cell is detected according to a result of the erase verify operation at step S450 (i.e., Erasure completed?), the peripheral circuit may increase the target level of the first erase voltage Vbulk1 by a step voltage Vstep according to an ISPE method at step S460 (i.e., Increase target level of erase voltage), and may perform an additional erase operation by supplying a second erase voltage Vbulk2 increased during operations (at S420 and S430) to the bulk of the memory block. In other words, a second target level TL2 of the second erase voltage Vbulk2 may be higher than the first target level TL1 of the first erase voltage Vbulk1 by the step voltage Vstep. However if it is determined that the erase operation has been completed (i.e., Yes) then the operation may end (i.e., End).

Here, the peripheral circuit may control a rising rate of the second erase voltage Vbulk2 in substantially the same manner as the rising rate of the first erase voltage Vbulk1 is controlled. Also, the peripheral circuit may set the rising rates of the first erase voltage Vbulk1 and the second erase voltage Vbulk2 to be the highest for initial rising periods R1 and R3, and may reduce the rising rates of the first erase voltage Vbulk1 and the second erase voltage Vbulk2 from when the electrons trapped in the selected memory cells start to be emitted to the substrate. For the other periods (R4, M2, F3 and F4), the second erase voltage Vbulk2 may be increased, maintained or discharged in substantially the same manner as the first erase voltage Vbulk1 is changed.

The above-described pulse shapes of the erase voltages are applicable to other semiconductor memory devices using high voltages as well as a NAND type semiconductor memory device.

According to an embodiment, stress applied to memory cells during operations of the memory cells may be minimized. In addition, the durability and reliability of the semiconductor memory device may be increased.

What is claimed is:

1. A semiconductor memory device, comprising:
    a memory array including a plurality of memory cells; and
    a peripheral circuit configured to perform an erase operation by supplying a first erase voltage to selected memory cells and perform an erase verify operation by supplying an erase verify voltage to the selected memory cells,
    wherein the peripheral circuit is configured to increase the first erase voltage to a first level at a first rising rate for a first rising period and increase the first erase voltage to a first target level at a second rising rate lower than the first rising rate for a second rising period, and
    wherein the first erase voltage continuously increases until the first erase voltage reaches the first target level.

2. The semiconductor memory device of claim 1, wherein the peripheral circuit is configured to supply the first erase voltage to a bulk of the selected memory cells.

3. The semiconductor memory device of claim 1, wherein the peripheral circuit is configured to increase the first erase voltage at the second rising rate from when electrons trapped in the selected memory cells start to be emitted to a substrate.

4. The semiconductor memory device of claim 1, wherein the second rising period is longer than the first rising period.

5. A semiconductor memory device, comprising:
    a memory array including a plurality of memory cells; and
    a peripheral circuit configured to perform an erase operation by supplying a first erase voltage to selected memory cells and perform an erase verify operation by supplying an erase verify voltage to the selected memory cells,
    wherein the peripheral circuit is configured to increase the first erase voltage to a first level at a highest rate for a first rising period and increase the first erase voltage to a first target level while reducing a rising rate for at least two other rising periods.

6. The semiconductor memory device of claim 5, wherein the peripheral circuit is configured to discharge the first erase voltage after the first erase voltage reaches the first target level.

7. The semiconductor memory device of claim 6, wherein the peripheral circuit is configured to maintain the first erase voltage at the first target level for a maintaining period until the first erase voltage is discharged after the first erase voltage reaches the first target level.

8. The semiconductor memory device of claim 6, wherein the peripheral circuit is configured to reduce the first erase voltage to the first level at a first falling rate for a first falling period and discharge the first erase voltage at a second falling rate higher than the first falling rate for a second falling period.

9. The semiconductor memory device of claim 8, wherein the first falling period is longer than the second falling period.

10. The semiconductor memory device of claim 8, wherein the first rising period has substantially the same time duration as the first falling period.

11. The semiconductor memory device of claim 5, wherein the peripheral circuit is configured to perform an additional erase operation, when non-erased cells are detected during the erase verify operation, by supplying a second erase voltage having a second target level higher than the first target level to the non-erased cells.

12. The semiconductor memory device of claim 11, wherein the peripheral circuit is configured to reduce a rising rate of the second erase voltage from when electrons trapped in the selected memory cells start to be emitted to a substrate.

13. The semiconductor memory device of claim 11, wherein the peripheral circuit is configured to control the first erase voltage and the second erase voltage so that the first and second erase voltages may be increased at the same rising rates for respective rising periods.

14. The semiconductor memory device of claim 5, wherein the at least two other rising periods are longer than the first rising period.

15. A method of operating a semiconductor memory device, the method comprising:
   increasing an erase voltage supplied to a bulk of selected memory cells to perform an erase operation to a first level at a first rising rate for a first rising period;
   increasing the erase voltage to a target level at a second rising rate lower than the first rising rate for a second rising period;
   discharging the erase voltage; and
   performing an erase verify operation on the selected memory cells,
   wherein the erase voltage continuously increases until the erase voltage reaches the target level.

16. The method of claim 15, wherein the second rising period is longer than the first rising period.

17. The method of claim 15, further comprising maintaining the erase voltage at the target level for a maintaining period until the discharging of the erase voltage after the increasing of the erase voltage to the target level.

18. The semiconductor memory device of claim 15, further comprising emitting electrons trapped in the selected memory cells to a substrate for the second rising period.

19. The semiconductor memory device of claim 15, wherein the discharging of the erase voltage comprises reducing the erase voltage at a first falling rate for a first falling period and discharging the erase voltage at a second falling rate higher than the first falling rate for a second falling period.

20. The semiconductor memory device of claim 19, wherein the erase voltage is reduced to the first level at the first falling rate for the first falling period.

21. The semiconductor memory device of claim 19, wherein the first falling period is longer than the second falling period.

* * * * *